(12) United States Patent
Mai (10) Patent No.: US 9,787,468 B2
(45) Date of Patent: Oct. 10, 2017

(54) LVDS DATA RECOVERY METHOD AND CIRCUIT

(71) Applicant: Capital Microelectronics Co., Ltd., Beijing (CN)

(72) Inventor: Rifeng Mai, Beijing (CN)

(73) Assignee: Capital Microelectronics Co., Ltd., Beijing (CN)

( * ) Notice: Subject to any disclaimer, the term of this patent is extended or adjusted under 35 U.S.C. 154(b) by 93 days.

(21) Appl. No.: 14/405,044

(22) PCT Filed: Apr. 22, 2014

(86) PCT No.: PCT/CN2014/075898
§ 371 (c)(1),
(2) Date: Dec. 2, 2014

(87) PCT Pub. No.: WO2015/161431
PCT Pub. Date: Oct. 29, 2015

(65) Prior Publication Data
US 2016/0285619 A1 Sep. 29, 2016

(51) Int. Cl.
| H04L 7/04 | (2006.01) |
| H04L 7/033 | (2006.01) |
| H04L 7/00 | (2006.01) |
| H03L 7/099 | (2006.01) |

(52) U.S. Cl.
CPC .............. *H04L 7/04* (2013.01); *H03L 7/0996* (2013.01); *H04L 7/0012* (2013.01); *H04L 7/0331* (2013.01); *H04L 7/0337* (2013.01)

(58) Field of Classification Search
CPC ......... H04L 7/04; H04L 7/033; H04L 7/0025; H04L 7/0337; H04L 7/0012; H04B 17/19

USPC ......................... 375/252, 294, 327, 371–376
See application file for complete search history.

(56) References Cited

U.S. PATENT DOCUMENTS

| 4,760,344 A * | 7/1988 | Takase ................ H04L 27/2332 329/307 |
| 5,175,544 A * | 12/1992 | McKeen ................. H03M 5/14 341/52 |
| 5,652,767 A * | 7/1997 | Kiyonaga ............... H04J 14/00 327/144 |
| 5,739,842 A * | 4/1998 | Murata ................ H04N 1/4058 347/132 |
| 6,262,611 B1 * | 7/2001 | Takeuchi .............. H04L 7/0337 327/150 |

(Continued)

*Primary Examiner* — Emmanuel Bayard
(74) *Attorney, Agent, or Firm* — Buchanan Ingersoll & Rooney PC (57) ABSTRACT

An LVDS data recovery method includes adopting three clocks to sample a received signal clock at the same time, wherein the first clock, the second clock and the third clock have the same frequency and different phases; determining whether the first clock is in the rising-falling edges of the received signal clock, in accordance with sampled levels of the received signal clock sampled by the three clocks at the same time; after determining the first clock is in the rising-falling edges of the received signal clock, adjusting phase of the first clock, and sampling the received data signal in accordance with adjusted phase of the first clock. The LVDS data recovery method ensures that the sampling clock edge is aligned with at the center of the data to be sampled. In case of high speed, the accuracy of the data sampling is guaranteed.

14 Claims, 10 Drawing Sheets

(56) References Cited

U.S. PATENT DOCUMENTS

| | | | | |
|---|---|---|---|---|
| 6,590,616 B1* | 7/2003 | Takeuchi | G09G 5/00 | 348/537 |
| 6,707,314 B2* | 3/2004 | Kasahara | G06F 13/385 | 326/38 |
| 6,751,745 B1* | 6/2004 | Yoshimura | H04L 7/0338 | 713/401 |
| 6,801,066 B2* | 10/2004 | Lee | H03L 7/0814 | 327/119 |
| 6,922,082 B2* | 7/2005 | Wijeratne | H03K 3/35625 | 326/105 |
| 6,987,825 B1* | 1/2006 | Yoshimura | H03K 5/135 | 327/144 |
| 6,990,597 B2* | 1/2006 | Abe | G06F 1/06 | 327/10 |
| 6,999,547 B2* | 2/2006 | Braceras | H03L 7/00 | 327/158 |
| 7,321,248 B2* | 1/2008 | Zhang | H03L 7/0814 | 327/149 |
| 7,433,397 B2* | 10/2008 | Garlepp | H04L 25/063 | 375/229 |
| 7,436,904 B2* | 10/2008 | Kwak | H04L 7/0337 | 327/141 |
| 7,446,616 B2* | 11/2008 | Lee | G06F 1/06 | 327/237 |
| 7,526,049 B2* | 4/2009 | Kushiyama | H04L 7/0337 | 375/326 |
| 7,672,417 B2* | 3/2010 | Si | H03L 7/0814 | 375/354 |
| 7,681,063 B2* | 3/2010 | Partovi | H03L 7/0814 | 375/326 |
| 7,715,509 B2* | 5/2010 | Stojanovic | H04L 25/063 | 375/354 |
| 7,817,767 B2* | 10/2010 | Tell | H03L 7/0814 | 375/236 |
| 7,844,021 B2* | 11/2010 | Gibbons | H03L 7/0812 | 375/371 |
| 8,026,749 B2* | 9/2011 | Bae | H03L 7/07 | 327/149 |
| 8,040,988 B2* | 10/2011 | Chang | H03L 7/07 | 327/141 |
| 8,238,501 B2* | 8/2012 | Yang | H03L 7/0814 | 375/355 |
| 8,290,107 B2* | 10/2012 | Takase | H04L 7/033 | 327/147 |
| 8,473,770 B2* | 6/2013 | Tsuchizawa | G01R 31/31709 | 713/400 |
| 8,674,736 B2* | 3/2014 | Toda | H03K 5/135 | 327/141 |
| 8,699,647 B2* | 4/2014 | Wenske | H03L 7/0807 | 375/355 |
| 8,786,333 B2* | 7/2014 | Lin | H03L 7/105 | 327/149 |
| 9,106,230 B1* | 8/2015 | Wang | H03K 19/1737 | |
| 9,112,655 B1* | 8/2015 | Hoang | H03L 7/0807 | |
| 9,191,184 B2* | 11/2015 | Baek | H04L 7/0037 | |
| 9,209,906 B2* | 12/2015 | Chen | H04B 10/60 | |
| 9,264,219 B1* | 2/2016 | Kang | H03L 7/091 | |
| 9,319,050 B1* | 4/2016 | Guilford | H03L 7/06 | |
| 9,335,372 B2* | 5/2016 | Van De Graaff | G01R 31/31725 | |
| 9,369,263 B1* | 6/2016 | Baecher | H04L 7/0025 | |
| 9,401,189 B1* | 7/2016 | Ding | G11C 7/222 | |
| 9,407,474 B2* | 8/2016 | Chen | H04L 25/03057 | |
| 9,432,176 B2* | 8/2016 | Yu | H04L 7/0025 | |
| 2002/0015247 A1* | 2/2002 | Rosky | G11B 20/10009 | 360/45 |
| 2002/0047738 A1* | 4/2002 | Kamihara | G06F 1/06 | 327/237 |
| 2002/0138540 A1* | 9/2002 | Enam | H03D 7/1433 | 708/835 |
| 2003/0081712 A1* | 5/2003 | Takada | H04L 7/0338 | 375/371 |
| 2003/0161427 A1* | 8/2003 | Nonaka | H03K 5/135 | 375/355 |
| 2005/0053180 A1* | 3/2005 | Nose | G06F 1/10 | 375/354 |
| 2005/0237966 A1* | 10/2005 | Aiello | H04B 1/7183 | 370/321 |
| 2006/0062341 A1* | 3/2006 | Edmondson | H03L 7/0814 | 375/376 |
| 2006/0066375 A1* | 3/2006 | LaBerge | G06F 1/12 | 327/291 |
| 2007/0018688 A1* | 1/2007 | Merk | G06F 1/105 | 326/93 |
| 2007/0127612 A1* | 6/2007 | Lee | H04L 7/0338 | 375/355 |
| 2010/0309744 A1* | 12/2010 | Park | G06F 13/1689 | 365/233.11 |
| 2012/0275555 A1* | 11/2012 | Ma | H04L 7/0004 | 375/362 |
| 2014/0347108 A1* | 11/2014 | Zerbe | H04L 7/0079 | 327/158 |
| 2014/0348279 A1* | 11/2014 | Chen | H03K 19/017509 | 375/355 |
| 2015/0139252 A1* | 5/2015 | Nguyen | H04J 3/0635 | 370/516 |

* cited by examiner

FIG. 1

PRIOR ART

FIG. 2

PRIOR ART

FIG. 3

PRIOR ART

Properly Aligned Sampling Phase

Inproperly Aligned Sampling Phase

FIG. 4a

Properly Aligned Sampling Phase in TxCk Spread Spectrum Modulation case

Inproperly Aligned Sampling Phase in TxCk Spread Spectrum Modulation case

LVDS DATA RECOVERY METHOD AND CIRCUIT

BACKGROUND

Technical Field

The present invention relates to electronic field, and in particular, to a LVDS data recovery method and circuit.

Related Art

Figure 1:
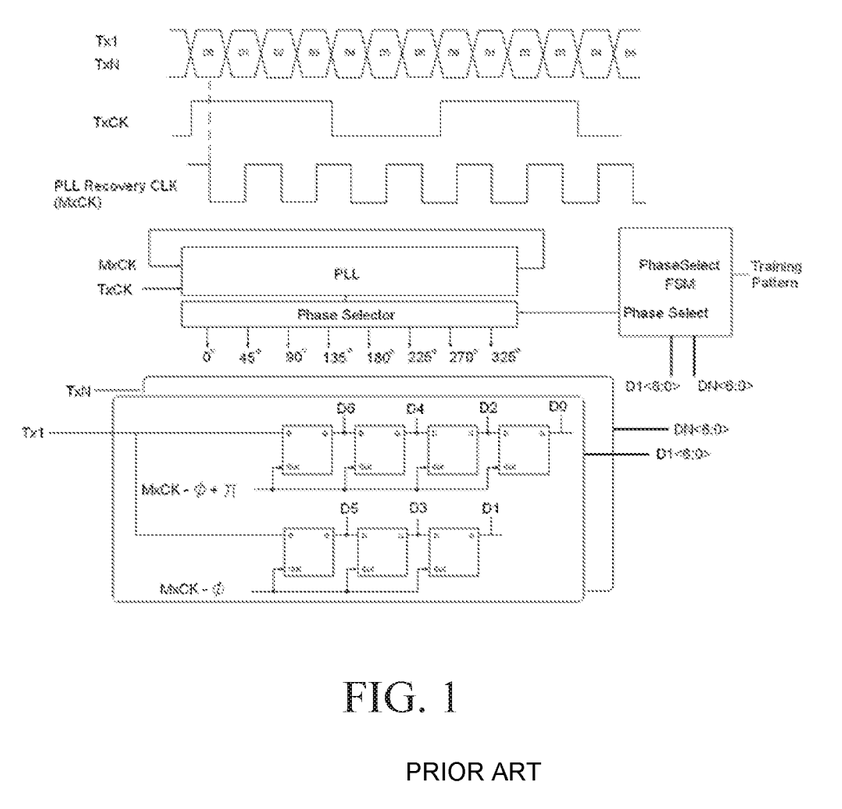
FIG. 1 is a schematic diagram of a first LVDS data recovery of the prior art.

FIG. 1 shows a traditional low voltage differential signaling (referred to below as LVDS) system, wherein an LVDS transmitter TX launches N channel data, Tx1, ..., TxN and sends a clock signal TxCk at the same time. These signals arrive at the side of receiver RX via cables, etc. At RX, the corrective phase locked loop PLL takes the TxCK as reference clock, to generate a clock MxCk whose frequency is M times of the TxCK. For video applications of low voltage differential signal, M can be selected to be 3.5 or 7. Due to deviation and channel adaptation problems, the clock MxCk used to sample the data signal may not be precisely aligned to the center of the data signals, therefore, it may lead to data-read error, and the Bit-Error Rate BERT may be much higher than pre-set level.

In order to solve the problems, a traditional method is based on a way of training sequences or training pattern to accurately aim at phase of the MxCk clock. For example, the RX sends a training sequence 101010 to the Tx, and then the Rx receives a data vector D<6:0> from the Tx. A state machine FSM adjusts the phase of MxCk on the basis of comparison results of the training sequences and the received data vector, so as to ensure that the clock edge of MxCk is just located in the center of the data. This method requires Tx sending a training sequence like 101010 ... or 010101, which is not available in many schemes, thus leading to limited application.

Figure 2:
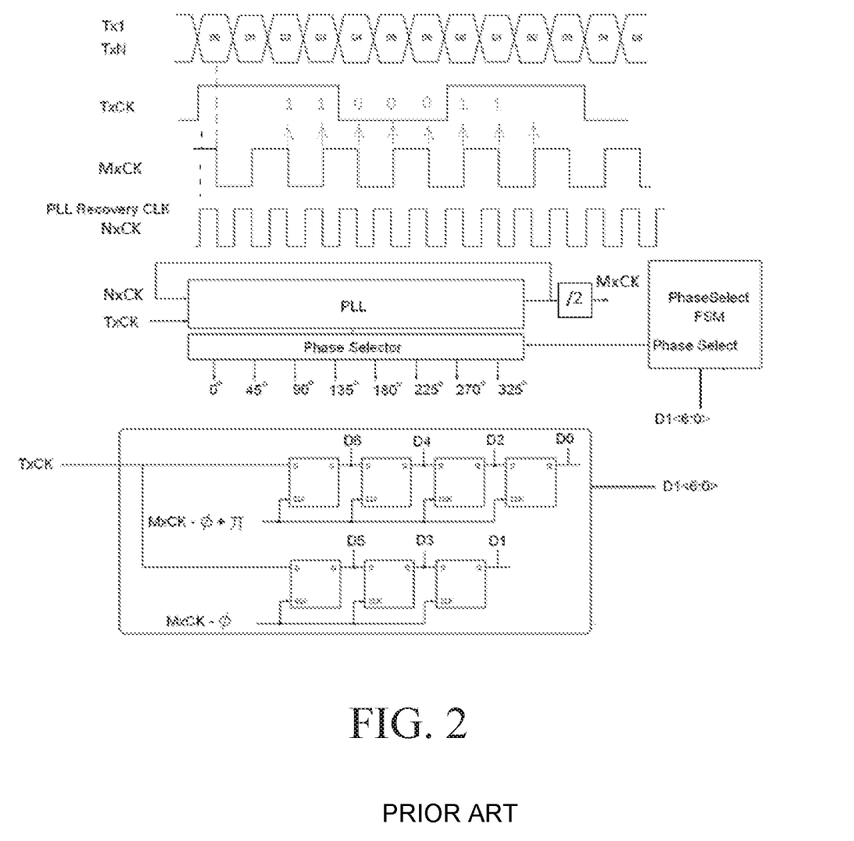
FIG. 2 is a schematic diagram of a second LVDS data recovery of the prior art.
Figure 3:
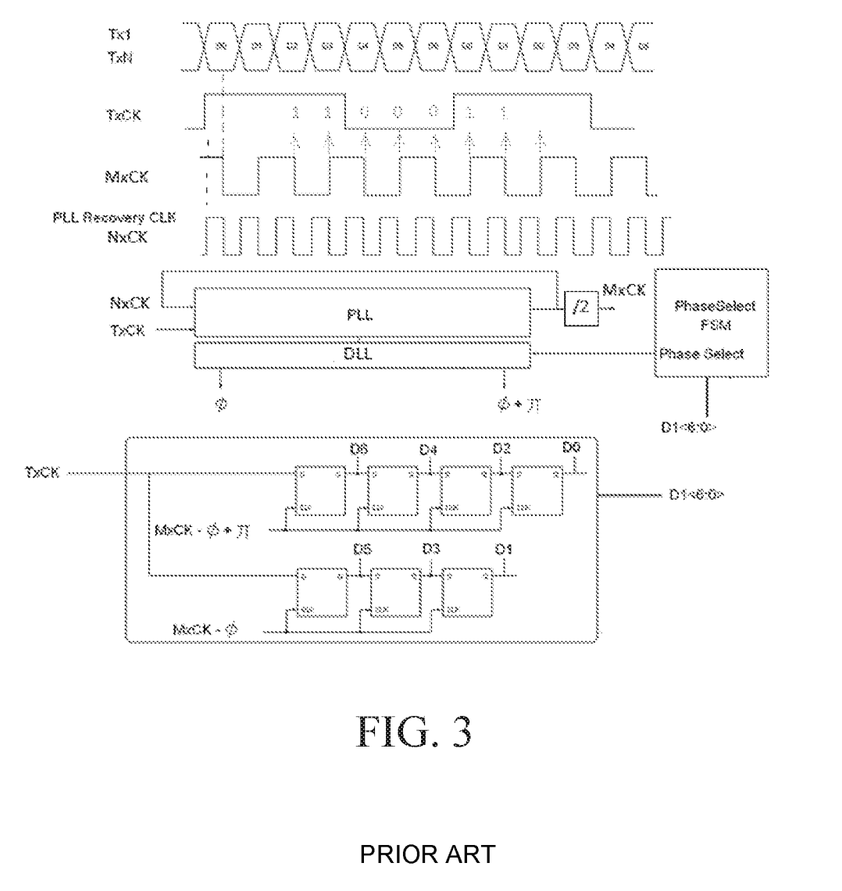
FIG. 3 is a schematic diagram of a third LVDS data recovery of the prior art.

FIG. 2 illustrates another scheme without training sequence, wherein the launched clock signal TxCk is sampled by adopting a correct phase of MxCk. After the phase has been accurately aligned, the pattern 1100011 will be displayed in recovery data D<6:0> shown in FIG. 2. The number of application phases is shown to be eight in FIG. 2, the eight phases can be obtained by a multiple-phase voltage-controlled oscillator in the phase locked loop PLL. In order to obtain higher precision phase, the PLL can be replaced with the DLL as shown in FIG. 3, so as to achieve effect of finer phase step.

Figure 4A:
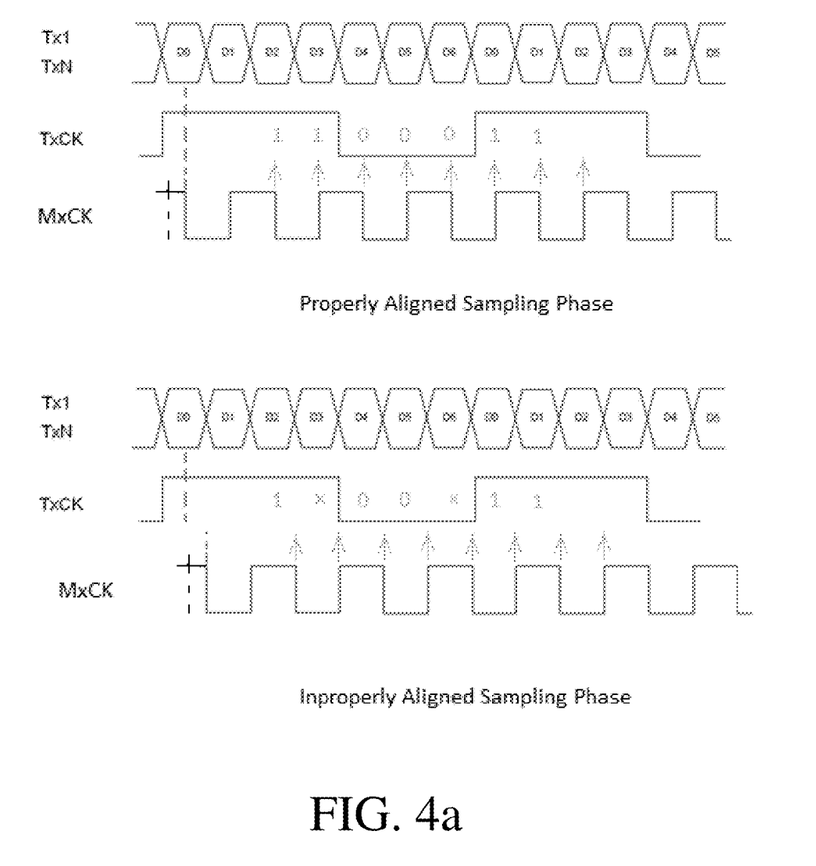
FIG. 4a is a state diagram of the prior art LVDS data sampling in case of low speed signal transmission.
Figure 4B:
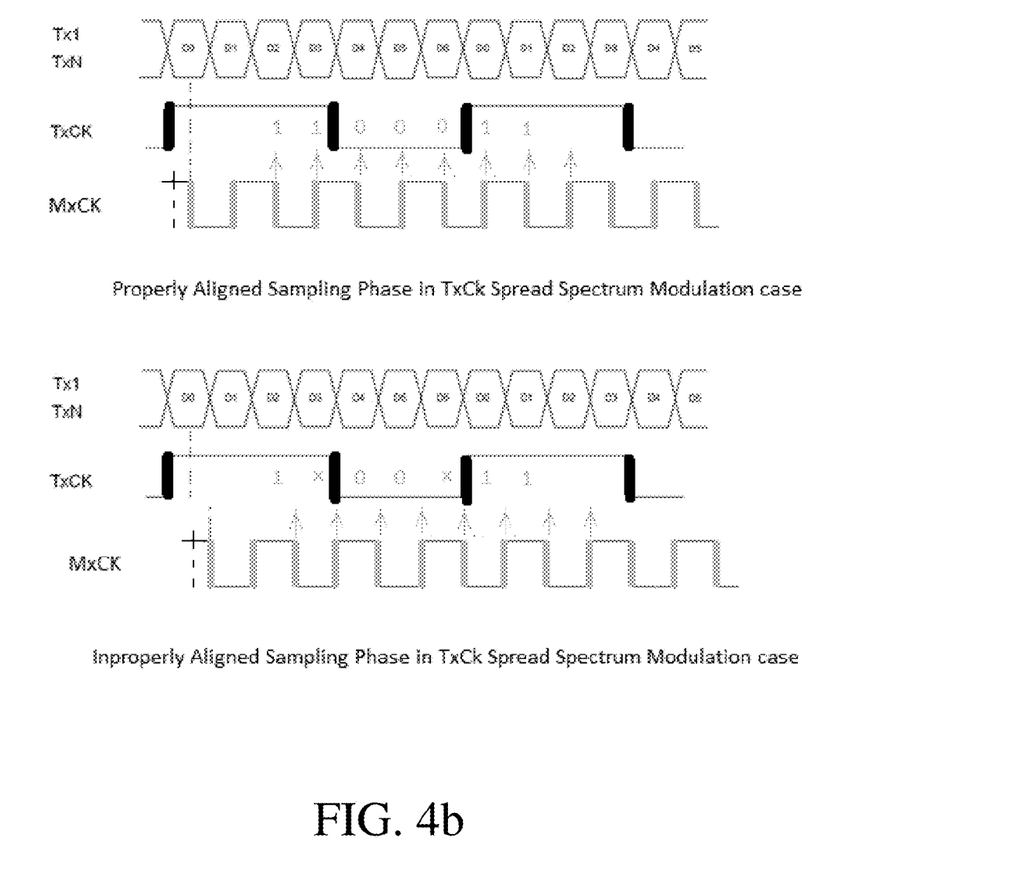
FIG. 4b is a state diagram of the prior art LVDS data sampling in case of low speed signal transmission.

The second scheme can work well in the case of low speed, but the clock MxCK or NxCK (being selected depending on a single- or double-edge sampling). used to sample in the case of high speed of TxCk may sample an edge of the clock signal TxCK, which may lead to reading results shown in FIG. 4a, especially lead to the case of the SSC (Spread-Spectrum Clocking) of TxCK shown in FIG. 4b. For the lower case in FIG. 4a, when the recovery data is 1x00x11, it may be any one of 1100011, 1100111, 1000011 and 1000111. If the state machine FSM determines 1 x00x11 to be 1100011, it will stop adjusting the MxCK clock phase, and selects current phase for data sampling. However, as it can be seen from the figure, the sampling clock MxCK is not aimed at the center of the data, thus problems may arise.

SUMMARY

An objective of the present invention is to provide an LVDS data recovery method, to ensure that the sampling clock is aligned to the center of the data signal by means of a simple but stable clock-edge-tracking method.

In order to implement the foregoing purpose, the present invention provides a LVDS data recovery method, the method comprises: adopting three clocks to sample a received signal clock at the same time, wherein the three clocks, the first clock, the second clock and the third clock, have the same frequency and different phases; determining whether the first clock is in the rising-falling edges of the received signal clock, in accordance with sampled levels of the received signal clock sampled by the three clocks at the same time; after determining the first clock is in the rising-falling edges of the received signal clock, adjusting phase of the first clock, and sampling the received data signal in accordance with adjusted phase of the first clock.

Preferably, the three clocks have equal phase differences.

Preferably, the rising-falling edges are rising edges or falling edges.

Preferably, determining whether the first clock is in the rising-falling edges of the received signal clock comprising: adjusting the phases of the three clocks in case that the sampled levels of the received signal clock have equal value.

Preferably, determining whether the first clock is in the rising-falling edges of the received signal clock comprising: in case that the sampled levels of the received signal clock have different values, determining that the first clock is in the rising-falling edges of the received signal clock.

Further preferably, determining whether the first clock is in the rising-falling edges of the received signal clock comprising: with a delay of a first time duration being added to the three clocks of different phase, re-sampling the received signal clock.

Further preferably, determining whether the first clock is in the rising-falling edges of the received signal clock comprising: when re-sampled levels have two equal levels and a different level, and the levels are in accordance with trend of the rising-falling edges of the judgment, determining that the first clock is in the rising-falling edges of the received signal clock.

At a second aspect, an embodiment of the present invention provides a LVDS data recovery circuit, comprising: a phase selection state machine, a phase locked loop and three sampling clock circuits, namely first sampling circuit, second sampling circuit, and third sampling circuit for generating a first clock, a second clock, and a third clock, respectively, wherein the first clock, the second clock and the third clock have the same frequency, but different phases; the phase locked loop outputs different phase, and the phase selection state machine is used for choosing three different phases for the three sampling clock circuits; the phase selection state machine controls the three sampling clock circuits, so that the three phase clocks are used to sample the received signal clock at the same time, and determines whether the first clock is in the rising-falling edges of the received signal clock, in accordance with sampled levels of the received signal clock sampled by the three clocks at the same time; after determining the first clock is in the rising-falling edges of the received signal clock, the phase selection state machine adjusts the phase of the first clock, and samples the received data signal in accordance with the adjusted phase of the first clock.

Preferably, the three clocks have equal phase difference therebetween.

Preferably, the rising-falling edges are rising edges or falling edges.

Preferably, the phase selection state machine adjusts the phases of the three clocks, in case that the sampled levels of the received signal clock sampled by the three clocks at the same time are three levels with equal value.

Preferably, the phase selection state machine determines the first clock is in the rising-falling edges of the received signal clock, in case that the sampling level of the received signal clock sampled by the three clocks at the same time have different values.

Further preferably, after the phase selection state machine delays the three clocks of different phases for the first time duration, and re-samples the received signal clock.

Further preferably, if re-sampled levels comprise two levels having equal value and one having a different value, and the re-sampled levels are in accordance with trend of the rising-falling edges, the phase selection state machine determines that the first clock is in the rising-falling edges of the received signal clock.

An embodiment of the present invention provides an LVDS data recovery method, can achieve a effect of accurately adjusting the sampling clock phase through acquiring clock edges accurately, so as to ensure that the sampling clock edge is aimed at the center of the data need sampled, and in the case of high speed, to ensure the accuracy of the data sampling.

DETAILED DESCRIPTION

The technical solution of the present invention is further described below in detail with reference to the accompanying drawings and embodiments.

The core idea of an embodiment of the invention lies in that: in a low voltage differential signal (LVDS) system, at the receiving side, TxCk is taken as a reference clock frequency to generate a clock MxCk whose frequency is M times of the TxCK, meanwhile two clocks having the same frequency as MxCK but different phase clock and the sampling clock MxCK are adopted to sample the transmission signal clock TxCK, and edge information of TxCK is determined according to results of the sampling, so as to determine an optimum MxCK sampling phase.

Figure 5:
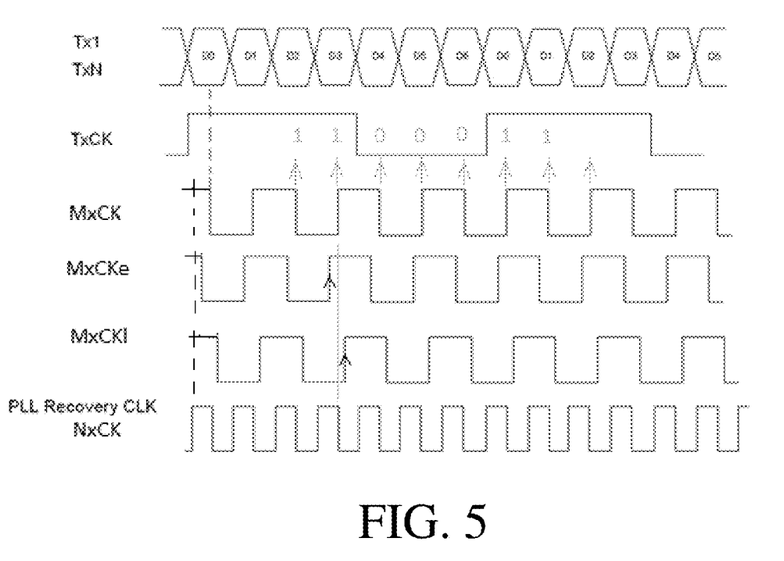
FIG. 5 is a schematic diagram of an embodiment of the present invention.
Figure 6:
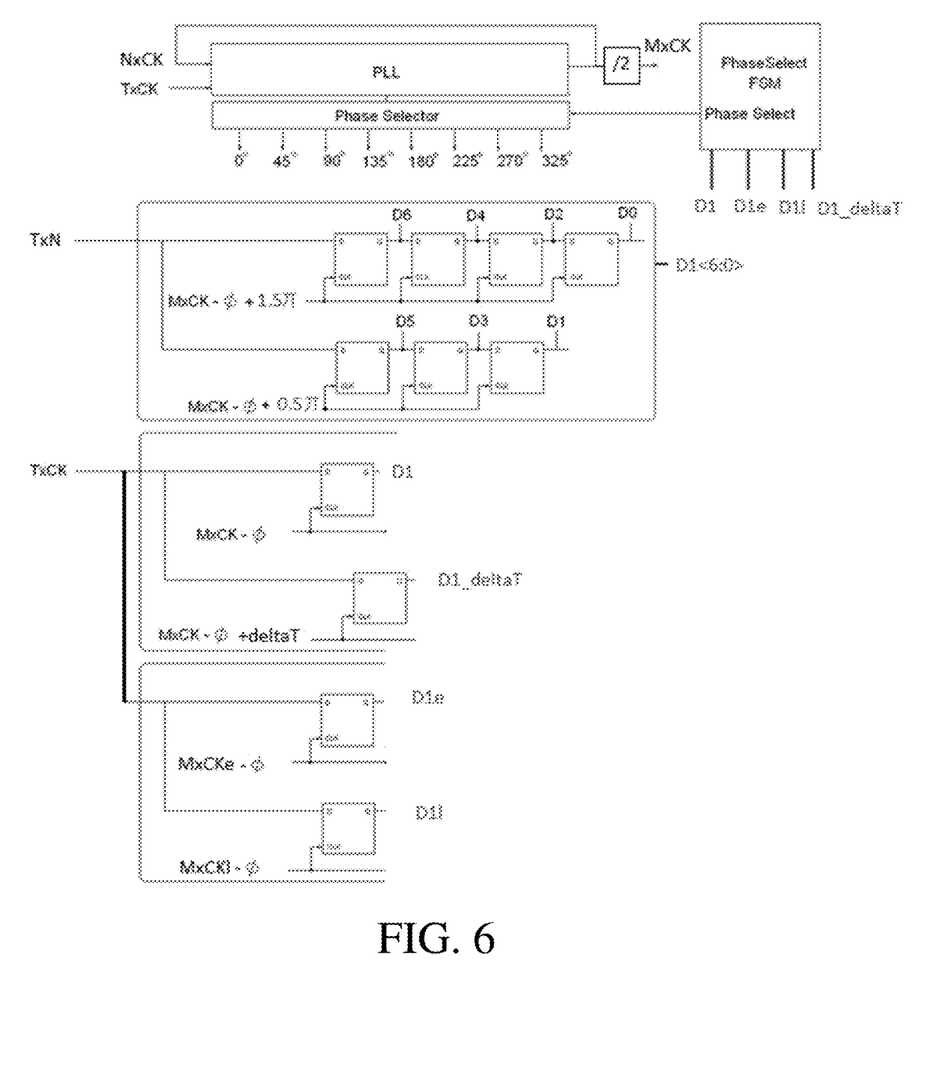
FIG. 6 is a structure diagram of LVDS data recovery circuit of an embodiment of the present invention.

FIG. 5 is a schematic diagram of an embodiment of the present invention; FIG. 6 is a structure diagram of LVDS data recovery circuit of an embodiment of the present invention. An LVDS data sampling of an embodiment of the present invention is described below specifically with reference to the accompanying FIG. 5 and FIG. 6.

As shown in FIG. 6, the LVDS data recovery circuit comprises a phase selection state machine FSM, a phase locked loop PLL, and three sampling clock circuits for generating respectively three ways of sampling clock, MxCK, MxCKe and MxCKl, wherein MxCK is used as a reference clock, the other two ways are as auxiliary sampling clocks. The phase selection state machine FSM controls and chooses phases for the three clocks. The phases of the three clocks may have equal phase differences or different phase differences. In an example, the PLL outputs eight kinds of clock phases, namely Ph0-Ph7; and the phase array of the three clocks can be as shown in table 1:

TABLE 1

| MxCke | MxCK | MxCKl |
|---|---|---|
| Ph7 | Ph0 | Ph1 |
| Ph0 | Ph1 | Ph2 |
| Ph1 | Ph2 | Ph3 |
| Ph2 | Ph3 | Ph4 |
| Ph3 | Ph4 | Ph5 |
| Ph4 | Ph5 | Ph6 |
| Ph5 | Ph6 | Ph7 |
| Ph6 | Ph7 | Ph0 |

FSM controls the three clocks to sample TXCK at the same time, and outputs sampling levels D1e, D1 and D1l sampled by the three clocks MxCKe, MxCK and MxCKl, respectively. Since the clock signals are sampled by the three clocks at the same time, which have phase differences therebetween, D1e, D1 and D1l may be the same or different.

As illustrated by the example of FIG. 5, if the levels sampled by the three clocks are all low levels, that is to say, D1e, D1 and D1l are 0, the level combination composed of the three levels is 000, it can be determined that the current phase adopted by MxCK is not aligned with rising edge of TXCK.

And now, FSM adjusts the clock phases output by the three sampling clocks, for example, in accordance with the phase combination order in table 1. When MxCKe, MxCK and MxCKl use Ph7, Ph0 and Ph1 respectively, the sampling level signal is 000, the phases of MxCKe, MxCK and MxCKl will be replaced with Ph2, Ph3 and Ph4 and this new phase combination will continue to be used for sampling TXCK. If this sampling level combination still leads to 000, it will continue to replace with the next set of phases according to the order of the table 1.

If, after adopting a new phase combination, assuming that the new phases of MxCKe, MxCK and MxCKl are Ph2, Ph3 and Ph4 respectively, the sampling level combination is 011, at this time it can be concluded that the MxCK just aligns with the rising edge of TXCK. Meanwhile, FSM records the current phase Ph3 of the reference sampling clock MxCK, and the recorded phase of Ph3 will be added a 90° (PI/2) to serve as a formal phase of the data sampling clock.

If, after the three clocks being replaced with a phase combination, assuming that the phases of MxCKe, MxCK and MxCKl are Ph1, Ph2 and Ph3 respectively, the sampling level combination is 001, the MxCK may have notaligned with the rising edge of TXCK. In one example, when FSM controls the reference sampling clock MxCK to sample the clock TXCK based on the current phase of Ph2, a delay of deltaT to the sampling time of MxCK may be considered. The TXCK will be sampled again after delaying MxCK for deltaT. If FSM continues to read 1 for the sampling level of MXCK, and 0 for the sampling level of MXCKe, it means that the MXCK aligned with the rising edge of TXCK. At this time, FSM records the current phase Ph2 of the reference sampling clock MxCK, and Ph3 will be add 90° (PI/2) to serve as a formal phase of data sampling clock. DeltaT may be selected in the length time of 100~200 ps.

If, after the clocks being replaced with a new phase combination, assuming that the phases of MxCKe, MxCK and MxCKl are Ph2, Ph3 and Ph4 respectively, the sampled level combination is 001, which means that the MxCK has not aligned with the rising edges of TXCK. At this time, FSM will adopt the reference sampling clock MxCK to sample in accordance with the current phase Ph2, but with a delay of DeltaT for the sampling time of MxCK. TXCK will be sampled with the delayed clock. If FSM still reads 0 for the sampled level of MXCK, and 0 for the sampled level of MXCKe, FSM will control the reference sampling clock MxCK to sample still in accordance with the current phase Ph2, but ph2 will have an additional delay of DeltaT. If FSM reads 1 for the sampled level of MXCK, and 0 for the sampled level of MXCKe, it can be concluded that the MXCK has aligned with the rising edges of TXCK. At this time, FSM records the current phase Ph2 of the reference sampling clock MxCK, and Ph3 will be added with 90° (PI/2) to serve as a formal phase of data sampling clock. DeltaT may be selected in the length time of 100~200 ps.

Table 2 lists possible level-reading results that may occur when reselecting phase after 000 is read,

TABLE 2

| state | MxCK | D1e | D1 | D11 | Phase |
|---|---|---|---|---|---|
| Q0 | Pha | 0 | 0 | X | |
| Q1 | Phb | 0 | x | 1 | |
| Q2 | Phc | X | 1 | 1 | |

The control statuses of FSM of an embodiment of the present invention may refer to table 3.

TABLE 3

| finite state machine (FSM) of phase selection | | | | |
|---|---|---|---|---|
| D1e | D1 | D11 | phase | action and state |
| 0 | 0 | 0 | phase incremented | looking for rising edges |
| 0 | 0 | 1 | kept to the next | rising edge-alignment check |
| 0 | 1 | 0 | reset | error data |
| 0 | 1 | 1 | kept to the next | rising edge-alignment check |
| 1 | 0 | 0 | kept to the next | falling edge-alignment check |
| 1 | 0 | 1 | Reset | error data |
| 1 | 1 | 0 | kept to the next | falling edge-alignment check |
| 1 | 1 | 1 | phase incremented | looking for falling edges |

Figure 7:
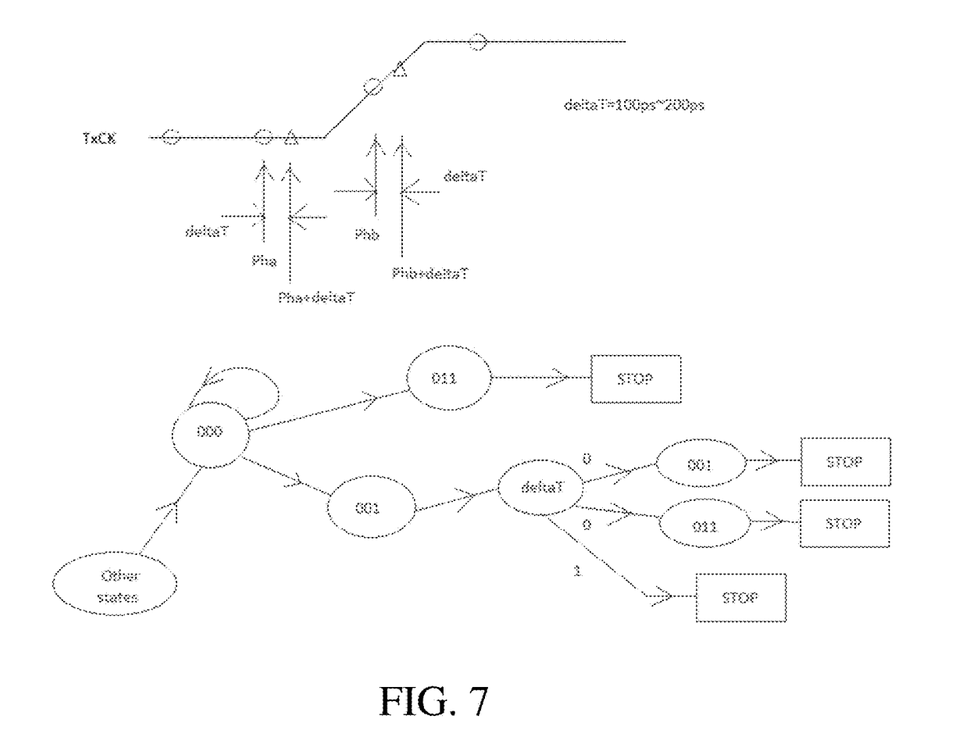
FIG. 7 is a state diagram of edge-determination in LVDS data recovery method of an embodiment of the present invention.
Figure 8:
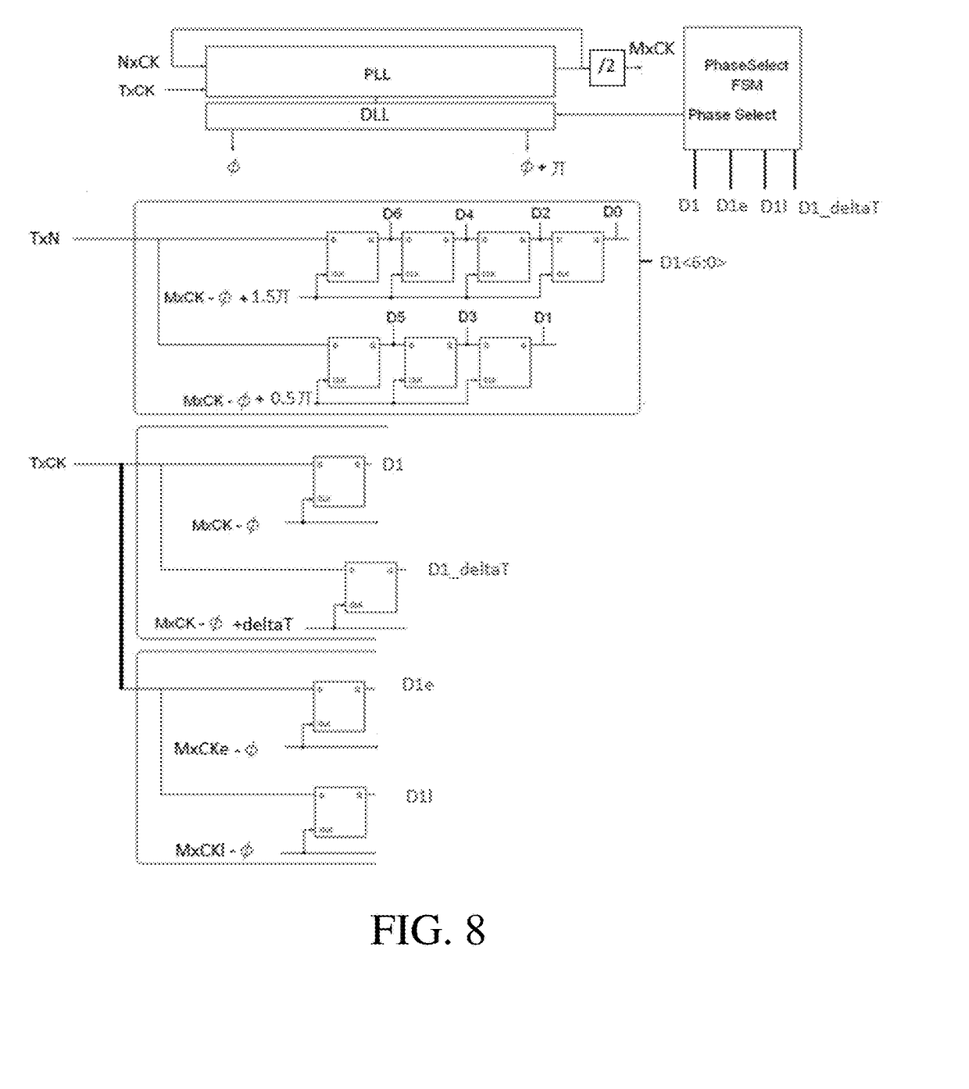
FIG. 8 is a structure diagram of LVDS data recovery circuit of another embodiment of the present invention.

In an embodiment of the present invention in FIG. 7, the phases of the three sampling circuits may be circulated between the 8 sets of phases used for selection in PLL. PLL can output more phases, or can update accordingly, to improve accuracy of the phase determination. In an example, in order to improve the accuracy of phase output, DLL is chosen as the circuit for phase output, as shown in FIG. 8, and details thereof are omitted.

The foregoing embodiment describes that the rising edges information of TxCK can be determined by three sampling clocks, so as to determine optimum sampling phase of MxCK. Similarly, a plurality of sampling clocks can also be used to determine information of falling edges of TxCK, thereby determining optimum sampling phase of MxCK.

Supposing that FSM controls the three clocks to sample TxCK at the same time, and outputs sampling levels D1e, D1 and D1l sampled by the three clocks MxCKe, MxCK and MxCKl, respectively. Since the clock signals are sampled by the three clocks at the same time, and the three clocks have the same phase differences among them, the resulting D1e, D1 and D1l may be the same, or be different.

If the levels that sampled by the three clocks at the same time are all high levels, that is, D1e, D1 and D1l are 1, the level combination composed of the three levels is 111, it can be determined that, with the current phase adopted, the MxCK has not aligned with the falling edges of TXCK.

At this time, FSM adjusts the clock phases output by the three sampling clocks, for example, in accordance with the phase combination order in table 1. For example, when MxCKe, MxCK and MxCKl adopt Ph7, Ph0 and Ph1 respectively, the sampled level signal is 111. Then, the three replaced clock phases of MxCKe, MxCK and MxCKl are Ph2, Ph3 and Ph4, respectively, with the combination of which, TXCK continues to be sampled. If this again-sampled level combination is still 111, the clock phases continue to be replaced with the next set of phases according to the order of the table 1.

If, after the three clocks being replaced with a new phase combination, assuming that the phases of MxCKe, MxCK and MxCKl are Ph2, Ph3 and Ph4 respectively, the sampled level combination is 100. It can be concluded that MxCK has just aligned with TXCK at the falling edges. Meanwhile, FSM records the current phase Ph3 of the reference sampling clock MxCK, and Ph3 will be added 90° (PI/2) to serve as the phase for formal data-sampling clock.

If, after the three clocks being replaced with a new phase combination, assuming that the phases of MxCKe, MxCK and MxCKl are Ph1, Ph2 and Ph3 respectively, the sampled level combination is 110. It can be concluded that the MxCK may have not aligned with the rising edges of TXCK. In an example, when FSM controls the reference sampling clock MxCK to sample TXCK in accordance with the current phase Ph2, a delay of deltaT can be considered to add into the sampling time of MxCK. With this delay, TXCK will be sampled again. If FSM then reads 0 for the sampled level of MXCK, and reads still 1 for the sampled level of MXCKe, it can be concluded that the MXCK has aligned with the falling edges of TXCK. FSM will record the current phase Ph2 of the reference sampling clock MxCK, and Ph3 will increase 90° (PI/2) to serve as a phase of formal data-sampling clock. DeltaT may usually be selected in the length time of 100~200 ps.

If, after the three clocks being replaced with a new phase combination, assuming that the phases of MxCKe, MxCK and MxCKl are Ph1, Ph2 and Ph3 respectively, the sampling level combination is 110, and the MxCK has not aligned with the rising edges of TXCK. FSM will control the reference sampling clock MxCK to sample the clock TXCK still in accordance with the current phase Ph2, but with a delay of DeltaT. With this delay, TXCK will be sampled again. If FSM reads still 1 for the sampled level of MXCK, and reads still 0 for the sampled level of MXCKe, FSM will control the reference sampling clock MxCK to sample still in accordance with the current phase Ph2, but one more delay of DeltaT being added to the sampling time of MxCK. If FSM reads 0 for the sampled level of MXCK, and still 1 for the sampled level of MXCKe, it can be concluded that the MXCK has aligned with the rising edges of TXCK. At this time, FSM records the current phase Ph2 of the reference sampling clock MxCK, and Ph3 will increases 90° (PI/2) to serve as a phase of formal data-sampling clock. DeltaT may usually be selected in the length time of 100~200 ps.

Figure 9:
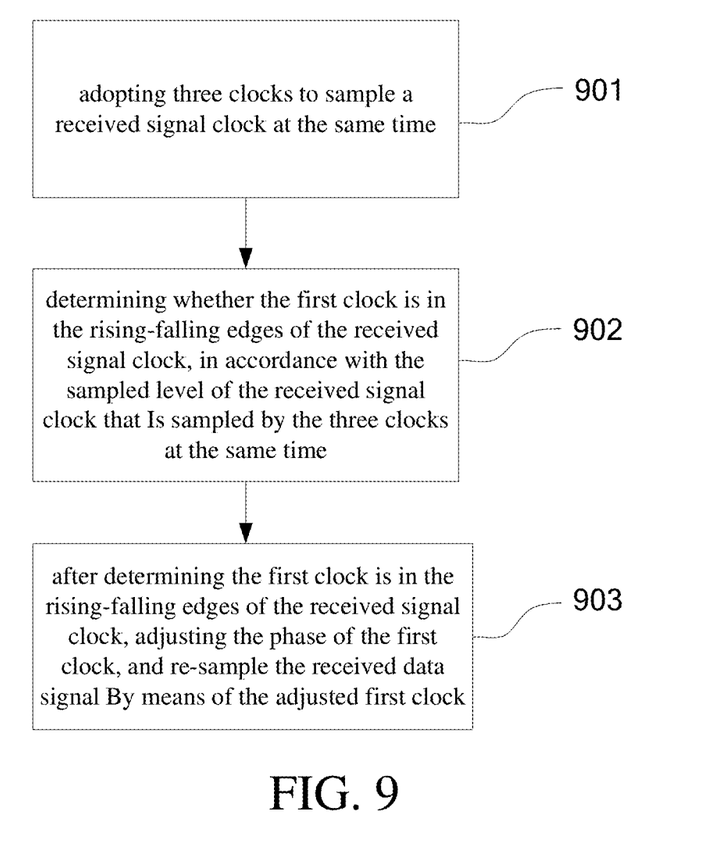
FIG. 9 is a flow diagram of LVDS data recovery method of an embodiment of the present invention.

FIG. 9 is a flow diagram of LVDS data recovery method of an embodiment of the present invention. As shown in FIG. 9, an embodiment of the present invention provides a LVDS data recovery method based on the above described circuit.

Step 901, adopting three clocks to sample a received signal clock at the same time, the three clocks having the same frequency, but with different phase, namely, the first clock, the second clock and the third clock, respectively.

Step 902, determining whether the first clock is in the rising-falling edges of the received signal clock, in accordance with the sampled levels of the received signal clock sampled by the three clocks at the same time.

Step 903, after determining the first clock is in the rising-falling edges of the received signal clock, adjusting the first clock phase, and sampling the received data signal in accordance with the adjusted first clock phase.

Wherein, it can be seen in combination with the foregoing embodiments that the phase differences in the three clocks is preferably equal, and the edges can be rising or falling ones.

Wherein, the step of 902 may further comprise:

in case that the sampled levels of the received signal clock sampled by the three clocks at the same time are three levels with the same value, adjusting the phases of the three clocks; and in case that the sampled levels of the received signal clock sampled by the three clocks at the same time have different values, determining that the first clock is in the rising-falling edges of the received signal clock.

After delaying the three different phase clocks for a first time duration, the received signal clock is re-sampled.

Preferably, the step of 903 comprises that, when the re-sampled levels have two equal levels and one different level, which is in accordance with the trend of the rising-falling edges, the first clock is determined to be in the rising-falling edges of the received signal clock.

Further, referring to the description in conjunction with the above embodiments for circuits, the three clocks of different phases sample the received signal in accordance with a first phase combination. The first phase combination comprises three phases with equal phase difference therebetween.

when the sampled level combination sampled by the three clocks of different phases is 000;

the three clocks of different phases sample the received signal in accordance with a second phase combination. The second phase combination comprises three phases with the equal phase difference therebetween;

When the sampled level combination sampled by the three clocks of different phase is 011;

determining whether the first clock is in the rising edges of the received signal clock.

When the sampled level combination sampled by the three clocks of different phases is 001, sampling the received signal clock after delaying the three clocks of different phases for the first time duration;

after that, if the sampled level combination sampled by the three clocks of different phase is 011;

determining whether the first clock is in the rising edges of the received signal clock.

In another embodiment, said step of determining whether the first clock is in the rising-falling edges of the received signal clock in accordance with the sampled levels of the received signal clock sampled by the three clocks at the same time comprising:

the three clocks of different phases sample the received signal in accordance with a first phase combination. The first phase combination comprises three phases with equal phase difference;

when the sampled level combination sampled by the three clocks of different phases is 111;

the three clocks of different phase sample the received signal in accordance with a second phase combination. The second phase combination comprises three phases with equal phase difference;

when the sampled level combination sampled by the three clocks of different phases is 100;

determining whether the first clock is in the falling edges of the received signal clock.

The three different phase clocks sample the received signal in accordance with the second phase combination. The second phase combination comprises three phases with equal phase difference; after that, if the sampled level combination sampled by the three clocks of different phase is 110; the received signal clock being re-sampled after the three clocks of different phase are delayed for the first time duration;

if the re-sampled level combination sampled by the three clocks of different phases is 100;

determining whether the first clock is in the falling edges of the received signal clock.

An embodiment of the present invention provides a LVDS data recovery method, can achieve an effect of accurately adjusting the sampling clock phase by means of accurately acquiring clock edges, so as to ensure that the sampling clock edge has aligned with at the center of the data to be sampled, and the accuracy of the data sampling can be guaranteed in the case of high speed transmission.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those skilled in the art may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art.

The objectives, technical solutions, and beneficial effects of the present invention have been described in further detail through the above specific embodiments. It should be understood that the above descriptions are merely specific embodiments of the present invention, but not intended to limit the protection scope of the present invention. Any modification, equivalent replacement, or improvement made without departing from the spirit and principle of the present invention should fall within the scope of the present invention.

What is claimed is:

1. A low voltage differential signaling (LVDS) data recovery method, wherein the method comprises:

adopting three clocks to sample a received clock signal at the same time, wherein the three clocks, the first clock, the second clock and the third clock, have the same frequency and different phases;

determining whether the first clock is in the rising-falling edges of the received signal clock, in accordance with sampled levels of the received signal clock sampled by the three clocks at the same time;

after determining the first clock is in the rising-falling edges of the received clock signal, adjusting a phase of the first clock, and sampling a received data signal in accordance with adjusted phase of the first clock.

2. The method according to claim 1, wherein the three clocks have equal phase differences.

3. The method according to claim 1, wherein the rising-falling edges are rising edges or falling edges.

4. The method according to claim 1, wherein determining whether the first clock is in the rising-falling edges of the received clock signal comprising:

adjusting the phases of the three clocks in case that the sampled levels of the received clock signal have equal value.

5. The method according to claim 1, wherein determining whether the first clock is in the rising-falling edges of the received clock signal comprising:

in case that the sampled levels of the received clock signal have different values, determining that the first clock is in the rising-falling edges of the received clock signal.

6. The method according to claim 5, wherein determining whether the first clock is in the rising-falling edges of the received clock signal comprising:

with a delay of a first time duration being added to the three clocks of different phase, re-sampling the received clock signal.

7. The method according to claim 6, wherein determining whether the first clock is in the rising-falling edges of the received clock signal comprising:

when re-sampled levels have two equal levels and a different level, and the levels are in accordance with trend of the rising-falling edges of the judgment, determining that the first clock is in the rising-falling edges of the received clock signal.

8. A low voltage differential signaling (LVDS) data recovery circuit, comprising:

a phase selection state machine, a phase locked loop, and three sampling clock circuits, namely a first sampling circuit, a second sampling circuit, and a third sampling circuit for generating a first clock, a second clock, and a third clock, respectively, wherein the first clock, the second clock and the third clock have the same frequency, but different phases;

the phase locked loop outputs different phase, and the phase selection state machine is used for choosing three different phases for the three sampling clock circuits;

the phase selection state machine controls the three sampling clock circuits, so that the three phase clocks are used to sample a received clock signal at the same time, and determines whether the first clock is in the rising-falling edges of the received clock signal, in accordance with sampled levels of the received signal clock sampled by the three clocks at the same time;

after determining the first clock is in the rising-falling edges of the received clock signal, the phase selection state machine adjusts the phase of the first clock, and samples a received data signal in accordance with the adjusted phase of the first clock.

9. The circuit according to claim 8, wherein the three clocks have an equal phase difference therebetween.

10. The circuit according to claim 8, wherein the rising-falling edges are rising edges or falling edges.

11. The circuit according to claim 8, wherein the phase selection state machine adjusts the phases of the three clocks, in case that the sampled levels of the received signal clock sampled by the three clocks at the same time are three levels with equal value.

12. The circuit according to claim 8, wherein the phase selection state machine determines the first clock is in the rising-falling edges of the received clock signal, in case that the sampling level of the received clock signal sampled by the three clocks at the same time have different values.

13. The circuit according to claim 12, wherein after the phase selection state machine delays the three clocks of different phases for a first time duration, and re-samples the received clock signal.

14. The circuit according to claim 13, wherein if re-sampled levels comprise two levels having equal value and one having a different value, and the re-sampled levels are in accordance with trend of the rising-falling edges, the phase selection state machine determines that the first clock is in the rising-falling edges of the received clock signal.

* * * * *